United States Patent
Grave et al.

(10) Patent No.: US 10,976,041 B2
(45) Date of Patent: Apr. 13, 2021

(54) LIGHTING DEVICE AND METHOD FOR PRODUCTION THEREOF

(71) Applicant: LUMILEDS LLC, San Jose, CA (US)

(72) Inventors: Manuel Grave, Aachen (DE); Udo Karbowski, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/736,346

(22) Filed: Jan. 7, 2020

(65) Prior Publication Data
US 2020/0217492 A1    Jul. 9, 2020

(30) Foreign Application Priority Data
Jan. 7, 2019    (EP) ..................... 19150537

(51) Int. Cl.
| | |
|---|---|
| *F21V 23/06* | (2006.01) |
| *F21V 29/70* | (2015.01) |
| *F21V 23/00* | (2015.01) |
| *F21Y 115/10* | (2016.01) |

(52) U.S. Cl.
CPC ............ *F21V 23/06* (2013.01); *F21V 23/001* (2013.01); *F21V 29/70* (2015.01); *F21Y 2115/10* (2016.08)

(58) Field of Classification Search
CPC .............................. F21V 23/06; F21V 23/001
See application file for complete search history.

(56) References Cited

U.S. PATENT DOCUMENTS

| | | |
|---|---|---|
| 9,854,633 B1 | 12/2017 | Lee et al. |
| 2009/0146584 A1 | 6/2009 | Ye et al. |
| 2015/0382420 A1* | 12/2015 | Sakai ................. H05B 45/44 315/193 |
| 2016/0366731 A1 | 12/2016 | Palfreyman et al. |
| 2017/0202061 A1* | 7/2017 | Allen .................. F21K 9/238 |
| 2017/0367158 A1* | 12/2017 | Petersen ............. F21S 4/22 |
| 2018/0003351 A1* | 1/2018 | Van Winkle ......... F21S 4/10 |

* cited by examiner

*Primary Examiner* — William N Harris
(74) *Attorney, Agent, or Firm* — Volpe Koenig

(57) ABSTRACT

The invention relates to a lighting device comprising at least two light-emitting elements and a method of producing a lighting device. The light-emitting elements are connected with each other into a module via a connection element. The connection element has at least one region spaced apart from the at least two light-emitting elements. At least two modules are connected with each other in parallel. The at least one region of the connection element has a specific electrical resistance that compensate differences between electrical characteristics of at least two light-emitting elements.

19 Claims, 2 Drawing Sheets

LIGHTING DEVICE AND METHOD FOR PRODUCTION THEREOF

FIELD OF INVENTION

The present invention relates to a lighting device comprising at least two light-emitting elements, wherein the light-emitting elements are connected with each other into a module via a connection element, wherein the connection element has at least one region, the at least one region being spaced apart from the at least two light-emitting elements, and wherein at least two modules are connected with each other in parallel. The invention also relates to a method for producing a lighting device.

BACKGROUND

Light-emitting diodes (LEDs) are nowadays produced for a wide range of applications and have increasingly replaced traditional light-bulbs, thanks to low power consumption, a wide palette of possible light colors, as well as a high flexibility concerning the design and in particular the geometry of lighting devices. Individual LEDs can be seen as punctual light sources, and several LEDs may be combined in order to achieve a light-source with larger dimensions and higher intensity. However, even though LEDs can be mass produced at an industrial scale with precisely controlled production conditions, fine differences between individual LEDs, even when produced in the same way, can still persist.

In LED production, typically the electronic properties of individual LEDs are measured for later integration into finished lighting devices. The generic term "binning" is generally employed for categorizing LEDs into groups, wherein the LEDs have similar parameter values, or at least parameters comprised within a predetermined tolerance range. The parameters used for defining a group may for example be forward voltage, threshold values for electrical characteristics, color of emitted light, or others. By combining LEDs of the same group, a higher homogeneity level in light emission can be achieved. However, fine differences between the individual LEDs may still be visible.

Usually individual LEDs are arranged on respective printed circuit boards or interposers, which are configured to dissipate heat generated by LEDs. It is known to integrate an electrical resistor as a surface mount device, for instance on such an interposer in order to compensate voltage differences between individual LEDs, such as different forward voltages, or different LED temperatures. However, electrical resistors generate heat by way of Joule heating and, as the electrical resistors are mounted on the same carrier as the LEDs, the temperature in the vicinity of individual LEDs increases.

During light emission by the LEDs, an uncontrolled temperature increase may disturb the light emission, e.g. in that color shifts and variations in intensity occur, such that the resistors may cause inhomogeneity between individual LEDs. Also, additional heat generated by the resistors may disturb the heat spreading function of the interposer. In addition, the resistors are arranged in the vicinity of the LEDs and therefore absorb part of the light-emitted by the LEDs, impairing the optical properties of the lighting device as a whole.

SUMMARY

The object of the present invention is to provide a lighting device and a method for producing a lighting device with improved optical and electrical characteristics, in particular with a more homogenous light emission.

This object is achieved according to a first teaching of the present invention by a lighting device comprising at least two light-emitting elements, wherein the light-emitting elements are connected with each other into a module via a connection element, wherein the connection element has at least one region, the at least one region being spaced apart from the at least two light-emitting elements, and wherein at least two modules are connected with each other in parallel. The lighting device according to the invention is characterized in that the at least one region of the connection element has a specific electrical resistance, wherein the electrical resistance of the at least one region of the connection element is configured to compensate differences between electrical characteristics of at least two light-emitting elements.

As a first advantage, the lighting device according to the invention allows for a voltage regulation by the region of the connection element spaced apart from the at least two light-emitting elements, instead or in addition to a voltage regulation by the light-emitting elements. Thus, the heat generation that is inherent to voltage regulation is moved away from the direct vicinity of the connected light-emitting elements and an influence of the voltage regulation and the resulting heat generation on the light emission may be minimized. In particular, disturbances in light emission, which could be caused by temperature elevation in the direct vicinity of LEDs, can be optimized.

As a second advantage of the invention, a dedicated electrical resistance integrated in individual lighting elements is not necessary anymore. Accordingly, it is possible to provide the lighting device with a more compact design, particularly to arrange individual LEDs closer to each other. Hence, a higher density of light-emitting elements or LEDs per unit length or per unit surface can be produced. This contributes to provide a lighting device with enhanced homogeneous appearance.

Light-emitting elements within a module can be connected in series. Light-emitting elements connected in series can form a group, which groups being connected in parallel, and several groups forming a module. Therefore, a compensation of differences in forward-voltage or temperature behavior between LEDs within a single module can also be envisaged, when groups of LEDs are connected in parallel within the module.

The electrical characteristics of the connection element can be chosen so as to compensate differences between LEDs inherent to production and/or differences between LEDs when in function, such as temperature elevation for instance. Differences inherent to production can manifest through binning effects or difference in forward-voltages, for instance. Voltage drop over wire length can also be an example of a criterion for choosing the electrical resistance of the connection element or of at least one region of the connection element. This is in particular the case when the lighting elements are powered via supply lines, wherein the dimension of the supply lines is such that non-negligible a voltage drop may occur that influences the intensity of the emitted light.

According to a first exemplary embodiment of the lighting device, the at least two light-emitting elements of each module are connected in series with each other, and the electrical resistance of the at least one region of the connection element is configured to compensate differences between electrical characteristics of the light-emitting elements of a first module and the electrical characteristics of the light-emitting elements of a second module.

This way differences in forward-voltage between LEDs, which belong to neighboring modules, for instance, can be compensated by adapting the electrical resistance of the connection elements within the respective modules. It is also conceivable to compensate differences in electrical characteristics between several modules, and/or between modules, which are positioned remote from each other or separated by further modules.

According to a further exemplary embodiment of the lighting device, each light-emitting element comprises at least one light-emitting diode arranged on a heat spreading element, and the connection element connects the respective heat spreading elements of the at least two light-emitting elements of a module. The at least one region of the connection element is then also spaced apart from the heat spreading elements.

By indirect connection of the LEDs of light-emitting elements via their respective heat spreading elements, heat eventually produced by the at least one region of the connection element is then located at a position remote from the LEDs and the heat spreading elements. Hence, a more stable temperature can be achieved in the direct vicinity of individual LEDs to be connected, thereby improving the overall light emission of the module.

A heat spreading element can take the form of a carrier structure such as a printed circuit board or an interposer, for instance. The interposer may comprise an anode contact, a cathode contact and a coupling pad. The coupling pad allows an electrical isolation of the anode contact with respect to the cathode contact. One anode contact of each module with light-emitting diodes is electrically connected to the anode track. One cathode contact of each module with light-emitting diodes is electrically connected to the cathode track. A coupling structure is bonded to the coupling pad of the interposer attached to the last light-emitting diode of a first module and to the coupling pad of the interposer attached to the first light-emitting diode of a second module. One anode contact of each module with of light-emitting diodes may be electrically connected to the anode track by means of an anode interconnect. One cathode contact of each module with light-emitting diodes may be electrically connected to the cathode track by means of a cathode interconnect.

Another example for a heat spreading element in the frame of the present invention can be a connection to a component with a higher thermal conduction. Other components of a lighting device can also be understood as heat spreading element, in particular component made of a material adapted for heat spreading or having a geometry adapted for heat spreading.

According to another exemplary embodiment of the lighting device, the electrical resistance of the connection element is chosen to compensate a difference between the forward voltage of a light-emitting diode of a first light-emitting element and the forward voltage of a light-emitting diode of a second light-emitting element. As an example, the first light-emitting element may belong to a first module and the second light-emitting element to a second module, wherein the first module and the second module are connected in parallel.

In this way, differences in light intensity emitted by connected LEDs can be avoided, in particular when the forward voltage of the respective LEDs is known. The forward voltage of each LED can be measured in advance and given as a component characteristic for the production of the lighting device.

In the case of a module with several lighting elements, for instance, the electrical resistance of the connection element can be chosen to correspond to an average of the forward voltages of the respective LEDs.

According to another exemplary embodiment of the lighting device, the electrical resistance of the at least one region of the connection element is chosen so as to affect the overall voltage of a module having at least one light-emitting diode, in particular to affect the steepness of the overall voltage-over-current characteristic curve of a module.

In particular, the overall voltage over current characteristic curve of a module with at least two LEDs and a connection element can be modified so as to reduce the steepness of the relation between voltage and current in the operating voltage range of the at least two LEDs. As a consequence, less difference in current can be obtained for a change from a voltage to another in the operating range of the at least two LEDs. This way, differences in forward voltages between LEDs connected in parallel, in particular LEDs connected in parallel within a module and/or LEDs belonging to respective modules connected in parallel can be compensated.

Additionally or alternatively, by adapting the electrical resistance of the at least one connection element, differences in behavior towards temperature, when in function, of LEDs of neighboring modules can be compensated.

A difference in forward voltage of 10% or less can be considered as covering the most commonly encountered cases. Consequently, a more homogeneous light emission can be achieved with a plurality of LEDs supplied by a common power source when affecting the voltage-over-current curve of a module within a tolerance range of about 10%.

According to another exemplary embodiment of the lighting device, at least one region of the connection element comprises an electrical wire, and the electrical resistance of the at least one region of the connection element is adapted via the length, the diameter and/or the material of the electrical wire.

A variation of the geometry of the like is a simple and cost-effective way to adapt the electrical resistance of the connection element. Alternatively or additionally, a material having an electrical resistance with the desired characteristics can be chosen for producing the connection element, or at least parts thereof. An example for such a material is constantan. Further, alternatively or additionally, the connection element may comprise at least one leaded resistor, and the characteristic electrical resistance thereof is than chosen in function of the properties of at least one light-emitting element.

According to another exemplary embodiment of the lighting device, for each light-emitting element, the at least one light-emitting diode is arranged on a first side of the a heat spreading element, and the at least one region of the connection element is arranged at least partially on a second side of the heat spreading element, wherein the second side is arranged opposite to the first side.

A first advantage of this exemplary arrangement is the larger distance between the region of the connection element and the light-emitting diode. The connection element and region of the connection element, which may emit Joule heat due to the specific electrical resistance, is at least in part thermally isolated from the LED positioned on the opposite face of the heat spreading element. In other words, a special separation or at least a spatial distance can be achieved between the LED and the connection element by means of the heat spreading element.

As the connection between the LEDs via respective heat spreading elements is achieved by the connection elements, which are not necessarily positioned between the interposers, but rather at the back side of the spreading elements, this exemplary embodiment also offers the possibility of positioning LEDs closer to each other.

A third advantage is an improved appearance and less absorption of emitted light, as the connection element is at least partially hidden behind the heat spreading element.

Alternatively, the connection element can be arranged on the same side of the heat spreading element as the LED. Then lighting device can be produced by contacting both LEDs and connection elements on the same face of respective interposers, thereby simplifying the overall production process.

According to another exemplary embodiment of the lighting device, the light-emitting elements are encapsulated. This way, the heat emitted by the connection element can be repelled from the light-emitting element, in particular when the connection element is not or at least mostly not included in the encapsulation of individual light-emitting elements. This may for instance be realized by encapsulating a LED on one face of a heat spreading element, wherein the connection element is arranged on another (opposite) face of the heat spreading element. Additionally, other elements of the lighting device may also be encapsulated. For instance, the connection elements may be encapsulated together with the light-emitting elements. In an embodiment, the entire lighting device is encapsulated.

By encapsulating at least the light-emitting elements, the heat spread, as well as light transmission and/or reflection may be controlled and enhanced, in particular depending on the material and geometry of the encapsulation.

The light-emitting elements may be encapsulated with a translucent material, for example, with a silicone polymer. The translucent material may be arranged to enable a homogeneous illumination during operation of the lighting device. The translucent material may, for example, comprise scattering particles or structures to support homogeneous light distribution. The scattering particles or structures may be arranged to mask positions of the light-emitting diodes within the lighting device while in operation.

The translucent material may, for example, be comprised by a light guiding structure. The light guiding structure may be surrounded by a frame structure such that light emitted by the light-emitting diodes leaves the light guiding structure via an opening of the frame structure. The frame structure may be arranged to reflect and redistribute light guided within the light guiding structure. The frame structure may especially comprise diffusely reflective surfaces supporting homogeneous light distribution.

According to another exemplary embodiment of the lighting device, each module is configured to be connected to an external power supply device. This way, each module can be used independently for emitting light, or as an electrical end for a string of modules. This is of particular interest when the lighting device is configured as a string of modules and cut to length after production. Then the module string can be supplied by connecting the first and/or the last modules with a power source.

According to another exemplary embodiment of the lighting device, the light-emitting elements are arranged principally along a longitudinal direction of the lighting device. A longitudinal arrangement of modules allows the production of a long string with a plurality of modules, which e.g. can be cut to a desired length afterwards, hence leading to increased production efficiency and flexibility responding to custom orders.

Alternatively, an arrangement of modules as a matrix in two or three dimensions is also conceivable. Correspondingly a surface or volume of modules can be produced, thereby enlarging the fields of possible applications for the lighting device.

In a further embodiment, the lighting device may be provided with at least one coupling structure for connecting individual modules with each other. This way, mechanical properties of the lighting device such as stiffness can be adapted. Alternatively or additionally, the at least one coupling structure may be connected with a heat distribution track of the lighting device, in order to enhance heat spreading. By combining the effects of connection elements with adapted electrical resistance and coupling structures or heat spreading structures, heat spreading within and between individual modules can be optimized.

The heat distribution track may, for example, be a metal foil or graphite foil attached to the outer surface or one of the surfaces of the lighting device. The coupling structure may comprise a material with high thermal conductivity, in order to enable an efficient overall cooling of the lighting device.

According to a second teaching of the invention, the above mentioned object is also achieved by a method for producing a lighting device, in particular the lighting device according to the first teaching of the present invention. This method comprises:

providing at least two light-emitting elements having respective electrical characteristics;

choosing at least one connection element with at least one region having an electrical resistance in dependence of at least one electrical characteristic of at least one of the light-emitting elements;

connecting the at least two light-emitting elements in series via the connection element so as to form a module; and connecting at least two modules in parallel.

Hence, the electrical resistance of the at least one region of the connection element can be adapted precisely to each combination of light-emitting element to be currently connected during the production of the lighting device. In this manner, differences between the individual electrical characteristics of light-emitting elements can be compensated in a targeted way and an overall improvement of the production quality can be achieved.

The selection of connection element with adapted characteristics can be performed automatically in function of previously determined characteristics of the individual light-emitting elements to be connected. By doing so, not only the quality of the production can be improved, but also the production speed and reliability.

Connecting the modules in parallel permits to ensure an increased homogeneity among several light-emitting elements commonly supplied by way of a single power source.

The connection of light-emitting elements into modules and the connection of modules with each other can be achieved simultaneously or successively.

According to a first exemplary embodiment of the method, each light-emitting element comprises a light-emitting diode, and the electrical resistance of the connecting element is chosen so as to compensate binning effects between the light-emitting diodes of the respective modules. Thereby, differences between LEDs can be compensated, in particular differences concerning electrical and/or optical characteristics, so that LEDs, which are not exactly similar, can be used for producing the lighting device. As a consequence, the cost-efficiency of the production can be improved.

Examples for electrical and/or optical characteristics are differences in characteristic thresholds for electrical values, forward voltage, behaviors towards temperature, when in function, and/or similar properties.

According to another exemplary embodiment of the method, the electrical resistance of the at least one region of the connecting element is chosen so as to compensate a voltage drop over a wire-length.

This way, a lighting device with large dimensions and/or a large number of light-emitting elements or modules can be produced and maintain an acceptable light-emission for the customer. Alternatively or additionally, a dedicated component can be provided to compensate larger voltage drop over a significant wire length.

According to another exemplary embodiment of the method, each provided light-emitting element comprises a light-emitting diode arranged on a first side of a heat spreading element, and, while connecting the at least two light-emitting elements, the at least one region of the connection element is arranged on an second side of the heat spreading elements of the respective light-emitting elements, wherein for each light-emitting element the second side is arranged opposite to the first side.

By doing so, the LEDs and connection elements can be contacted simultaneously on individual faces of respective heat spreading elements, and consequently the time-efficiency of the production can be improved.

Further advantages inherent to this production method are similar to the advantages described above for the lighting device.

According to an alternative exemplary embodiment of the method, each provided light-emitting element comprises a light-emitting diode arranged on a first side of a heat spreading element, and while connecting the at least two light-emitting elements, the at least one region of the connection element is arranged on the first side of the heat spreading elements as the respective light-emitting elements. For each light-emitting element, a second side arranged opposite to the first side may be configured for heat spreading and/or heat sinking.

This way light-emitting diodes and connection elements can be mounted using only one face of the lighting device, thus simplifying the production process.

The embodiments described above may individually be applied to the lighting device and the method, and may further be combined with each other.

BRIEF DESCRIPTION OF THE DRAWINGS

In the following, the invention will be explained in more detail by way of the attached drawings. Therein.

DETAILED DESCRIPTION OF THE PREFERRED EMBODIMENTS

In the following, identical reference signs are used for designating similar parts of the lighting device or parts of the lighting device having similar functions. This does not exclude possible different configurations of the individual parts represented.

Figure 1:
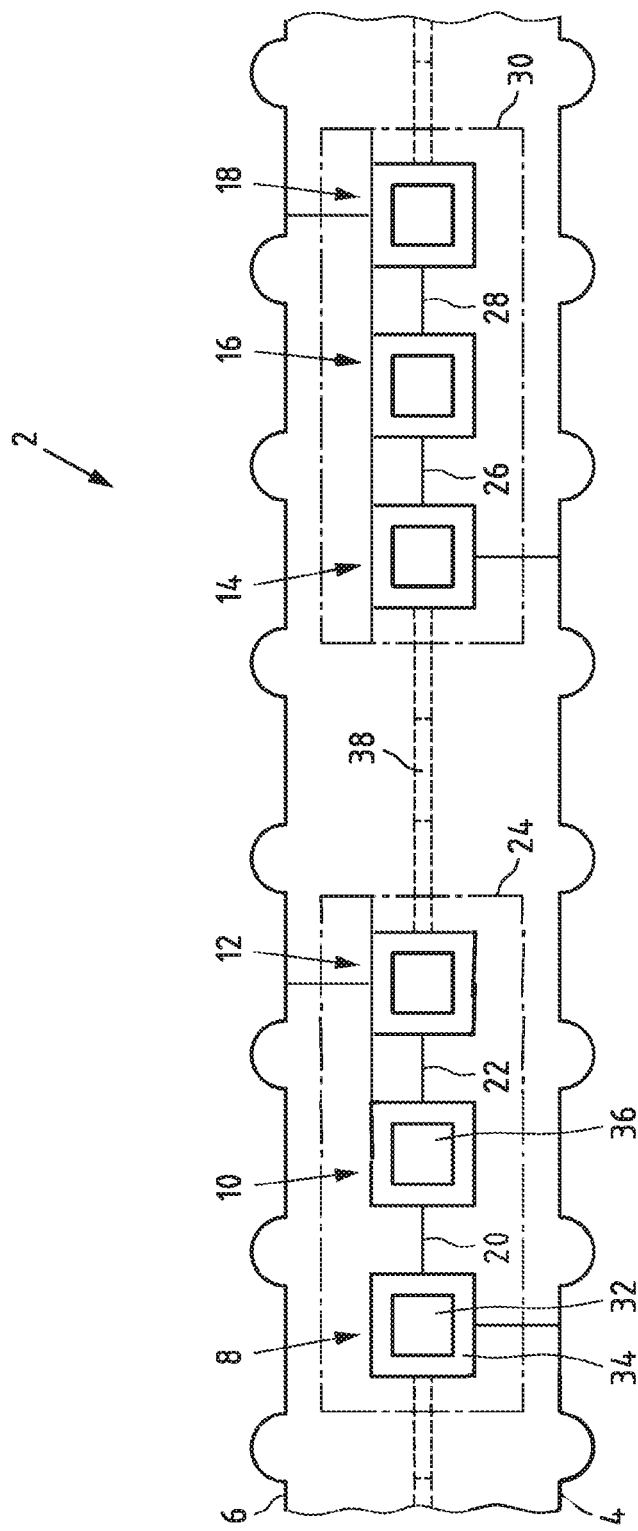
FIG. 1 shows a diagram of a lighting device according to the invention.

FIG. 1 shows a diagram of a lighting device 2 according to the invention. The lighting device 2 is provided with an anode track 4, with a cathode track 6 and with six light-emitting elements 8, 10, 12, 14, 16, 18, wherein three light-emitting elements 8, 10, 12 are connected with each other in series via two connections elements 20, 22 into a first module 24, and wherein three further light-emitting elements 14, 16, 18 are connected with each other in series via two connections elements 26, 28 into a second module 30. The first module 24 and the second module 30 are connected with each other in parallel by means of the anode track 4 and the cathode track 6.

Each light-emitting element 8, 10, 12, 14, 16, 18 comprises an LED 32, 36 arranged on an interposer 34 configured as heat spreading element. The LEDs 32, 36 are arranged on a top side 40 of the respective interposers 34 and the connection elements 20, 22, 24, 26 as well as the contacts with the anode track 4 and the cathode track 6 are arranged on the back-side 42 of the respective interposers 34.

The LEDs of the modules 24, 30 have individual characteristic forward voltages, which differ in comparison to each other. Each connection element 20, 22, 26, 28 is formed as electrical wire and is connected with the respective interposers 34 of two neighboring light-emitting elements 8, 10, 12 or 14, 16, 18 of a same module 24, 30. Each connection element 20, 22, 26, 28 has a region with an electrical resistance is configured to compensate the difference between the forward voltage of a light-emitting diode 32 of a first light-emitting element 8, which belongs to a first module 24, and the forward voltage of a light-emitting diode 36 of a second light-emitting element 10, which belongs to a second module 30. In the present embodiment, the combination of the electrical resistances of the connection elements 20, 22, 26, and 28 is configured to compensate the difference between the sum of the forward-voltages of the light-emitting diodes of the module 24 and the sum of the respective forward voltages of the light-emitting diodes of the neighboring module 30.

Here, the region of a connection element 20, 22, 26, 28 having an adapted electrical resistance correspond to substantially the entire respective connection element 20, 22, 26, 28. However, the region of a connection element according to the present invention may correspond to a reduced portion of the connection element, in comparison to the entire length of the connection element. For instance, a leaded resistor comprising a resistive region with a specific resistance is provided in the connection element.

The first module 24 and the second module 30 are mechanically coupled by means of a coupling structure 38. The coupling structure 38 provides the lighting device 2 with additional stiffness, so as to enable a homogeneous bending of the lighting device 2.

During operation, the modules 24, 30 are supplied with an electrical voltage applied to the cathode track 6 and the anode track 4. Differences in forward voltage between the individual LEDs 32, 36 are compensated by lowering the voltage at the entry of at least one of the LEDs 32, 36 via the configuration of the specific resistance of the regions of the connection elements 20, 22, 26, 28, thus homogenizing the light-emission.

Figure 2:
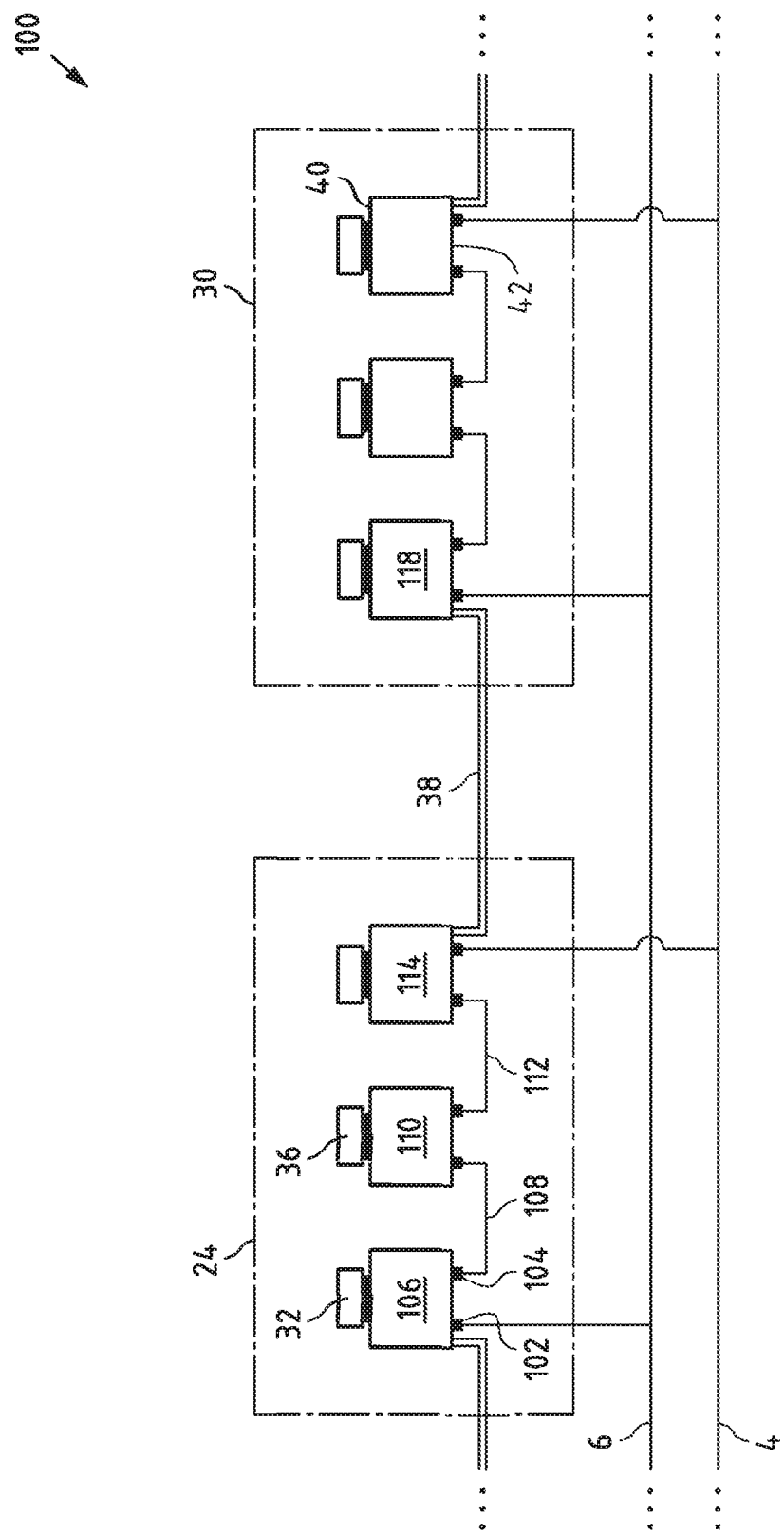
FIG. 2 shows schematically a longitudinal cross-section of a first embodiment of a lighting device in a side view.

FIG. 2 shows a longitudinal cross-section of a lighting device 100 in a schematic side view. The lighting device 100 comprises two modules 24, 30 each with three light-emitting elements 8, 10, 12 or 14, 16, 18 having a LED 32 and an interposer 34, respectively. Similarly to the lighting device in FIG. 1, the light-emitting elements 8, 10, 12, 14, 16, 18 of a module 24, 30 are connected in series, wherein the modules 24, 30 are connected in parallel and with a cathode track 6 and with an anode track 4.

The individual interposers 106, 110, 114, 118 have at least two interconnects 102, 104 for contacting with further components of the lighting device 100. Within a first module 24, a first interposer 106 is contacted with the cathode track 6 and with a first connection element 108. Within the same module 24, a second interposer 110 is contacted with the first connection element 108 and with a second connection element 112, while a third interposer 114 is contacted with the second connection element 112 and with the anode track 4. The second module 30 has similar means for connection.

Similar to the lighting device of FIG. 1, the individual connections elements 108, 112 are electrical wires with each an electrical resistance adapted to the difference in forward voltage between the respective LEDs arranged on the interposers 106, 110, 114. The third interposer 114 of the first module 24 and the first interposer 118 of the second module 30 are mechanically coupled by means of coupling structure 38.

What is claimed is:

1. A lighting device comprising:
   at least two modules connected with each other in parallel, each of the at least two modules comprising:
      a plurality of light-emitting elements comprising at least a first light-emitting element and a second light-emitting element each comprising a heat spreading element and a light-emitting diode on the heat spreading element, and
      at least one connection element connecting the heat spreading element of each of the plurality of light-emitting elements of each of the at least two modules with each other, the at least one connection element having at least one region spaced apart from the plurality of light-emitting elements and having a specific electrical resistance that compensates a difference between a first forward voltage of the light-emitting diode of the first light-emitting element and a second forward voltage of the light-emitting diode of the second light-emitting element.

2. The lighting device according to claim 1, wherein:
   the plurality of light-emitting elements of each of the at least two modules are connected in series with each other, and
   the specific electrical resistance of the at least one region of the at least one connection element further compensates differences between first electrical characteristics of the plurality of light-emitting elements of a first one of the at least two modules and second electrical characteristics of the plurality of light-emitting elements of a second one of the at least two modules.

3. The lighting device according to claim 1, wherein the specific electrical resistance of the at least one region of the at least one connection element is chosen so as to affect a voltage applied to at least one of the at least two modules.

4. The lighting device according to claim 3, wherein the specific electrical resistance of the at least one region of the at least one connection element is chosen so to affect a steepness of a current versus voltage characteristic curve of the at least one of the at least two modules.

5. The lighting device according to claim 1, wherein:
   the at least one region of the at least one connection element comprises an electrical wire, and
   the specific electrical resistance of the at least one region of the at least one connection element is adapted via at least one of a length, a diameter or a material of the electrical wire.

6. The lighting device according to claim 1, wherein:
   for each of the plurality of light-emitting elements, the light-emitting diode is arranged on a first side of the heat spreading element, and
   the connection element is arranged at least partially on a second side of the heat spreading element that is opposite the first side of the heat spreading element.

7. The lighting device according to claim 1, wherein at least the plurality of light-emitting elements are encapsulated.

8. The lighting device according to claim 1, wherein each of the at least two modules is configured to be connected to an external power supply device.

9. The lighting device according to claim 1, wherein the plurality of light-emitting elements are arranged substantially along a longitudinal direction of the lighting device.

10. A method for producing a lighting device comprising:
    providing a plurality of light-emitting elements each comprising a heat spreading element and a light-emitting diode on the heat spreading element;
    choosing a plurality of connection elements with at least one region having an electrical resistance that compensates a difference between a forward voltage of a light-emitting diode of one of the plurality of light-emitting elements and a forward voltage of a light-emitting diode of another one of the plurality of light-emitting elements;
    connecting the heat spreading element of at least two of the plurality of light-emitting elements in series via at least one of the plurality of connection elements to form a first module;
    connecting an other at least two of the plurality of light-emitting elements in series via another at least one of the plurality of connection elements to form a second module; and
    connecting the first module and the second module in parallel.

11. The method according to claim 10, wherein the plurality of connection elements are further chosen such that the electrical resistance of the at least one region compensates binning effects between the light-emitting diodes of the first module and the second module.

12. The method according to claim 10, wherein the plurality of connection elements are further chosen such that the electrical resistance of the at least one region compensates a voltage drop over a wire-length.

13. The method according to claim 10, wherein, for each of the plurality of light-emitting elements, the light-emitting diode is arranged on a first side of the heat spreading element, and the connecting the at least two of the light-emitting elements in series comprises arranging the at least one region of the at least one of the plurality of connection elements on a second side of the heat spreading element of the at least two of the light-emitting elements, the second side of the heat spreading element being opposite the first side of the heat spreading element.

14. The method according to claim 10, wherein, for each of the plurality of light-emitting elements, the light-emitting diode is arranged on a first side of the heat spreading element, and the connecting the other at least two of the light-emitting elements in series comprises arranging the at least one region of the other at least one of the plurality of connection elements on a second side of the heat spreading element of the other at least two of the light-emitting elements, the second side of the heat spreading element being opposite the first side of the heat spreading element.

15. The method according to claim 10, wherein, for each of the plurality of light-emitting elements, the light-emitting diode is arranged on a first side of the heat spreading element, and the connecting the at least two of the light-emitting elements in series comprises arranging the at least one region of the at least one of the plurality of connection elements on the first side of the heat spreading element of the at least two of the light-emitting elements.

16. The method according to claim 10, wherein, for each of the plurality of light-emitting elements, the light-emitting diode is arranged on a first side of the heat spreading element, and the connecting the other at least two of the light-emitting elements in series comprises arranging the at least one region of the other at least one of the plurality of connection elements on the first side of the heat spreading element of the other at least two of the light-emitting elements.

17. The method of claim 10, wherein the plurality of connection elements are further chosen such that the electrical resistance of the at least one region compensates differences between first electrical characteristics of the plurality of light-emitting elements of the first module and second electrical characteristics of the plurality of light-emitting elements of the second module.

18. The method of claim 10, further comprising encapsulating the plurality of light-emitting elements.

19. The method of claim 10, further comprising arranging the plurality of light-emitting elements substantially along a longitudinal direction of the lighting device.

* * * * *